United States Patent
Chung

(10) Patent No.: US 7,884,440 B2
(45) Date of Patent: Feb. 8, 2011

(54) SEMICONDUCTOR INTEGRATED CIRCUIT

(75) Inventor: Yi-Sun Chung, Chungcheongbuk-do (KR)

(73) Assignee: MagnaChip Semiconductor, Ltd., Chungcheongbuk-Do (KR)

( * ) Notice: Subject to any disclaimer, the term of this patent is extended or adjusted under 35 U.S.C. 154(b) by 166 days.

(21) Appl. No.: 11/785,673

(22) Filed: Apr. 19, 2007

(65) Prior Publication Data

US 2007/0252731 A1 Nov. 1, 2007

(30) Foreign Application Priority Data

Apr. 26, 2006 (KR) .................. 10-2006-0037865
Mar. 16, 2007 (KR) .................. 10-2007-0026209

(51) Int. Cl.
*H01L 21/70* (2006.01)

(52) U.S. Cl. .............. 257/499; 257/374; 257/501; 257/506

(58) Field of Classification Search ............. 257/499, 257/374, 501, 506, E27.032, E27.067; 438/221–224, 438/296, 359–361, 424–438, 257
See application file for complete search history.

(56) References Cited

U.S. PATENT DOCUMENTS

| 4,673,446 | A | * | 6/1987 | Thompson et al. | 148/33 |
| 4,885,623 | A | * | 12/1989 | Holm-Kennedy et al. | 257/290 |
| 5,807,784 | A | * | 9/1998 | Kim | 438/423 |
| 5,990,512 | A | * | 11/1999 | Diorio et al. | 257/314 |
| 6,057,588 | A | * | 5/2000 | Yamazaki | 257/506 |
| 6,312,996 | B1 | * | 11/2001 | Sogo | 438/298 |
| 6,396,107 | B1 | * | 5/2002 | Brennan et al. | 257/362 |
| 6,635,551 | B2 | | 10/2003 | Aton | |
| 6,887,798 | B2 | * | 5/2005 | Deshpande et al. | 438/777 |
| 7,076,757 | B2 | * | 7/2006 | Hirata | 716/10 |
| 7,132,347 | B2 | * | 11/2006 | Himi et al. | 438/405 |
| 2003/0111707 | A1 | * | 6/2003 | Takaura et al. | 257/510 |
| 2003/0234438 | A1 | * | 12/2003 | M Huang et al. | 257/547 |
| 2005/0023554 | A1 | | 2/2005 | Chu et al. | |
| 2005/0040436 | A1 | * | 2/2005 | Sorada et al. | 257/206 |
| 2005/0093047 | A1 | * | 5/2005 | Goda et al. | 257/300 |
| 2006/0023506 | A1 | * | 2/2006 | Jung | 365/185.05 |
| 2006/0040451 | A1 | * | 2/2006 | Lotfi et al. | 438/305 |

FOREIGN PATENT DOCUMENTS

| CN | 1547775 | 5/2003 |
| JP | 06-069436 | 3/1994 |
| KR | 10-2003-0057391 | 7/2003 |
| KR | 2005-0013190 | 2/2005 |
| KR | 10-2006-0010885 | 2/2006 |

* cited by examiner

*Primary Examiner*—Leonardo Andújar
*Assistant Examiner*—Jordan Klein
(74) *Attorney, Agent, or Firm*—Morgan Lewis & Bockius LLP

(57) ABSTRACT

A semiconductor integrated circuit including digital circuits and analog circuits integrated over a single substrate includes the substrate including portions where the digital circuits and the analog circuits are to be formed, and a plurality of deep-wells formed to a certain thickness inside the substrate to surround portions where devices of the digital circuits and devices of the analog circuits are to be formed to reduce interference between the devices of the analog circuits and the digital circuits.

23 Claims, 4 Drawing Sheets

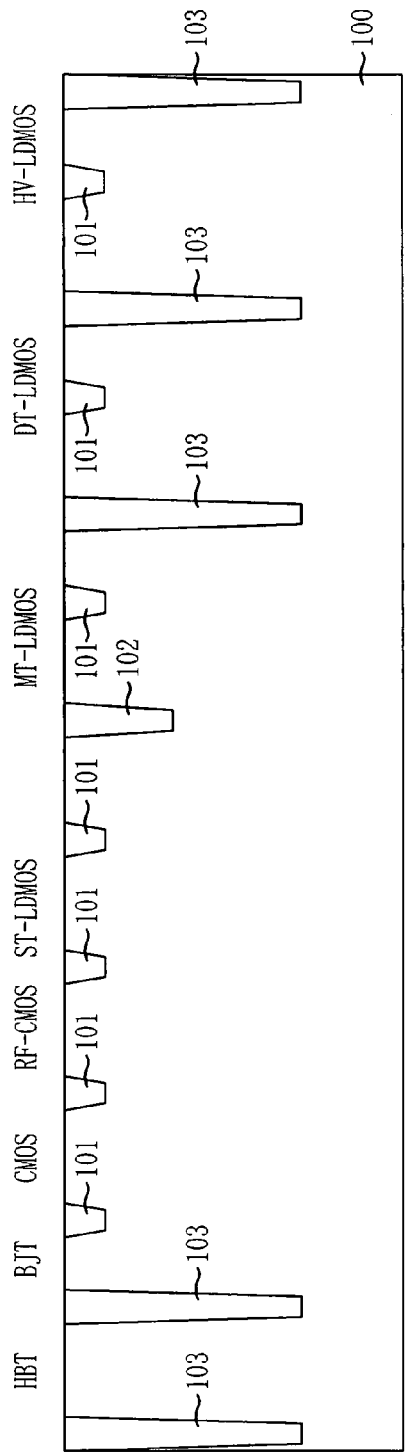
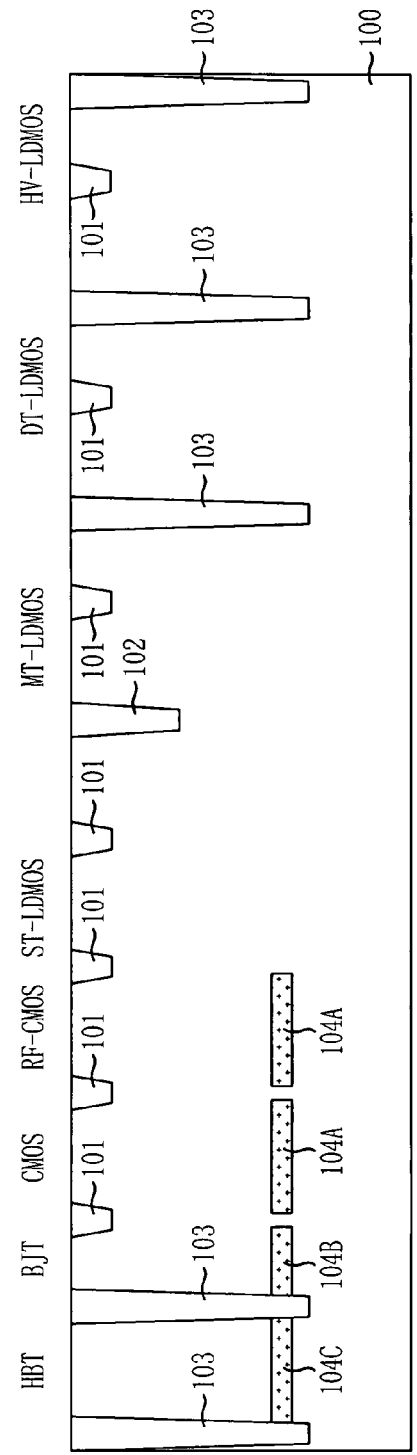
FIG. 2A
FIG. 2B

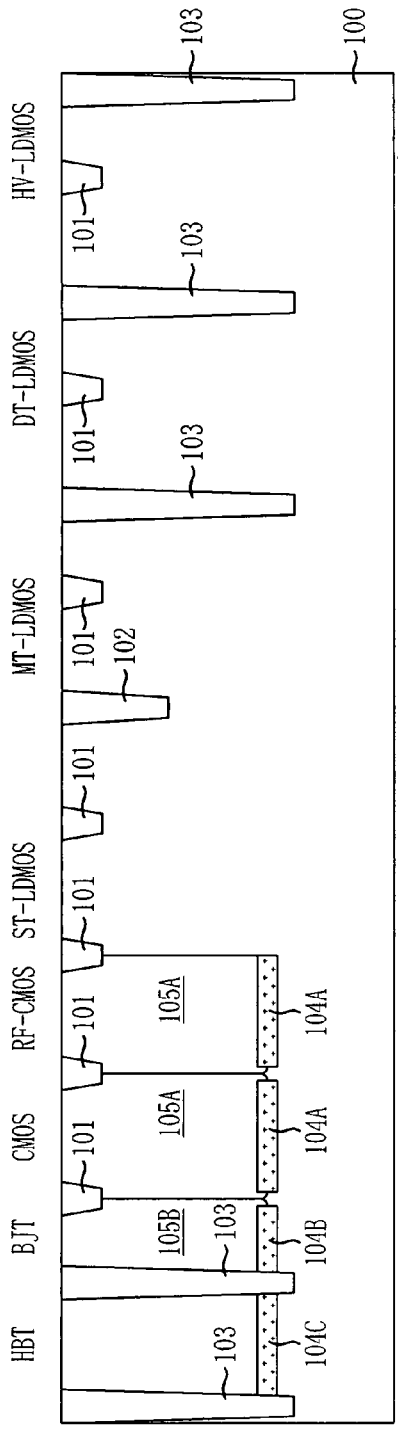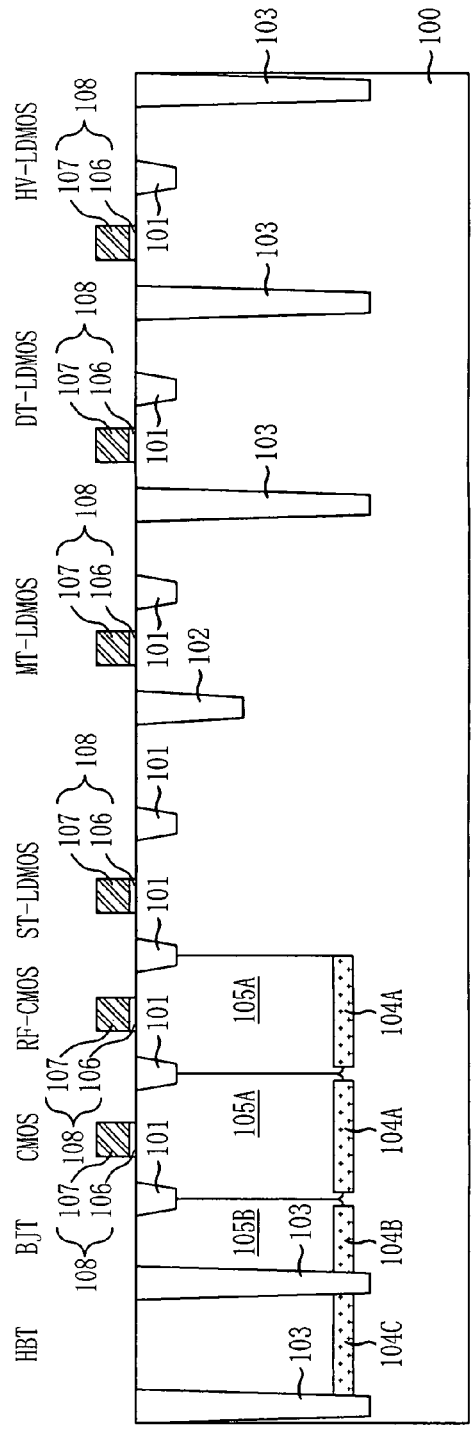

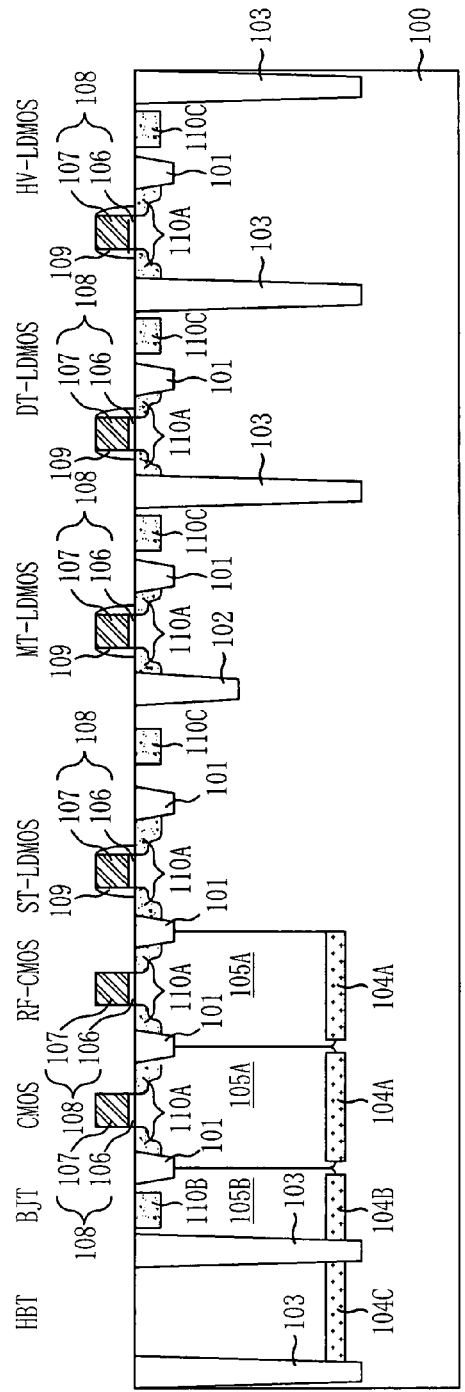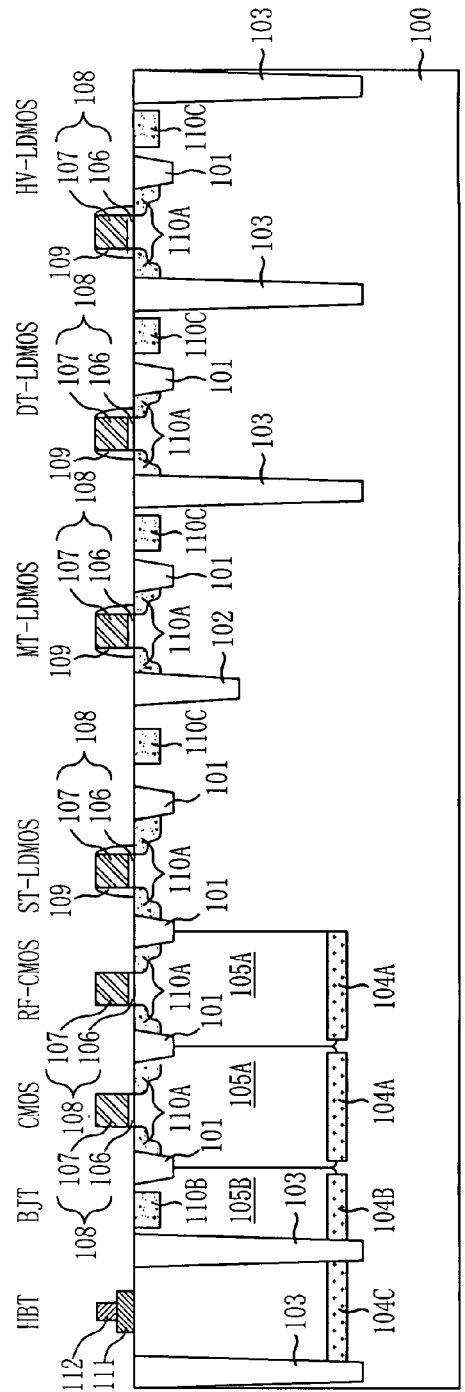

SEMICONDUCTOR INTEGRATED CIRCUIT

CROSS-REFERENCE TO RELATED APPLICATIONS

The present invention claims priority of Korean patent application numbers 10-2006-0037865 and 10-2007-0026209, respectively filed on Apr. 26, 2006 and Mar. 16, 2007, which are incorporated by reference in their entirety.

BACKGROUND OF THE INVENTION

The present invention relates to an integrated circuit of a semiconductor device and a method for fabricating the same, and more particularly, to an integrated circuit capable of supporting digital circuits, analog circuits, and radio frequency (RF) circuits by using a single micro chip.

Modular system on chips (MSOC) including modular bipolar complementary metal oxide semiconductor-discrete metal oxide semiconductor single integrated circuits have been used for integrated circuits of smart cards to embody telecommunication system for high frequency and high internal pressure including automotive power integrated circuits and direct current/direct current converts with the increasing demand. The single integrated circuits simultaneously support digital circuits, analog circuits and radio frequency (RF) circuits. Accordingly, the digital circuits, the analog circuits ad the RF circuits are integrated on the single integrated circuits. Through the use of the single integrated circuits, quality and quantity of portable RF devices for wireless and optical communication applications can be improved.

However, the integration of various types of the circuits provides various limitations. One of the limitations is a cross talk incurred due to a unique property of the various types of the circuits. In the case of arranging the various circuits over the single integrated circuits, an interaction between the circuits can be possible through a substrate of the single integrated circuit. The use of the single integrated circuit is very weak to the cross talk among the digital circuits, the analog circuits and the RF circuits.

The analog circuits are very sensitive to any electric noise generated by other circuits or devices. The digital circuits are less sensitive to the electric noise compared to the analog circuits due to a digital property thereof. However, the digital circuits generate a large amount of current noise due to the digital property. Accordingly, in the case of integrating the analog and digital circuits together over the single integrated circuit, since the noise generated by the digital circuits can affect the analog circuits, the analog circuits should be isolated from the electric noise generated by the analog circuits.

SUMMARY OF THE INVENTION

Embodiments of the present invention are directed toward providing a semiconductor integrated circuit, wherein for a single integrated circuit to simultaneously support digital circuits, analog circuits and radio frequency (RF) circuits, the semiconductor integrated circuit can stably isolate the analog circuits from an electric noise.

Embodiments of the preset invention are directed toward providing a semiconductor integrated circuit, wherein the semiconductor integrated circuit can reduce a size of a single integrated circuit to simultaneously support digital circuits, analog circuits and RF circuits.

Embodiments of the present invention are directed toward providing a semiconductor integrated circuit, wherein as for a single integrated circuit to simultaneously support digital circuits, analog circuits, and RF circuits, the semiconductor integrated circuit can stably isolate devices enabled at a high voltage with a level larger than about 30 V, e.g., a diffused metal oxide semiconductor (DMOS) device.

Embodiments of the present invention are directed toward providing a semiconductor integrated circuit, wherein as for a single integrated circuit to simultaneously support digital circuits, analog circuits, and RF circuits, the semiconductor integrated circuit minimizes a fabrication cost.

In accordance with one aspect of the present invention, there is provided a semiconductor integrated circuit including digital circuits and analog circuits integrated on a single substrate, including: the substrate including portions where the digital circuits and the analog circuits are to be formed; and a plurality of deep-wells formed to a certain thickness inside the substrate to surround portions where devices of the digital circuits and devices of the analog circuits are to be formed to reduce cross talk between the devices of the analog circuits and the digital circuits.

BRIEF DESCRIPTION OF THE DRAWINGS

FIGS. 2A to 2F illustrate a method for fabricating the semiconductor integrated circuit shown in FIG. 1.

DESCRIPTION OF SPECIFIC EMBODIMENTS

Figure 1:
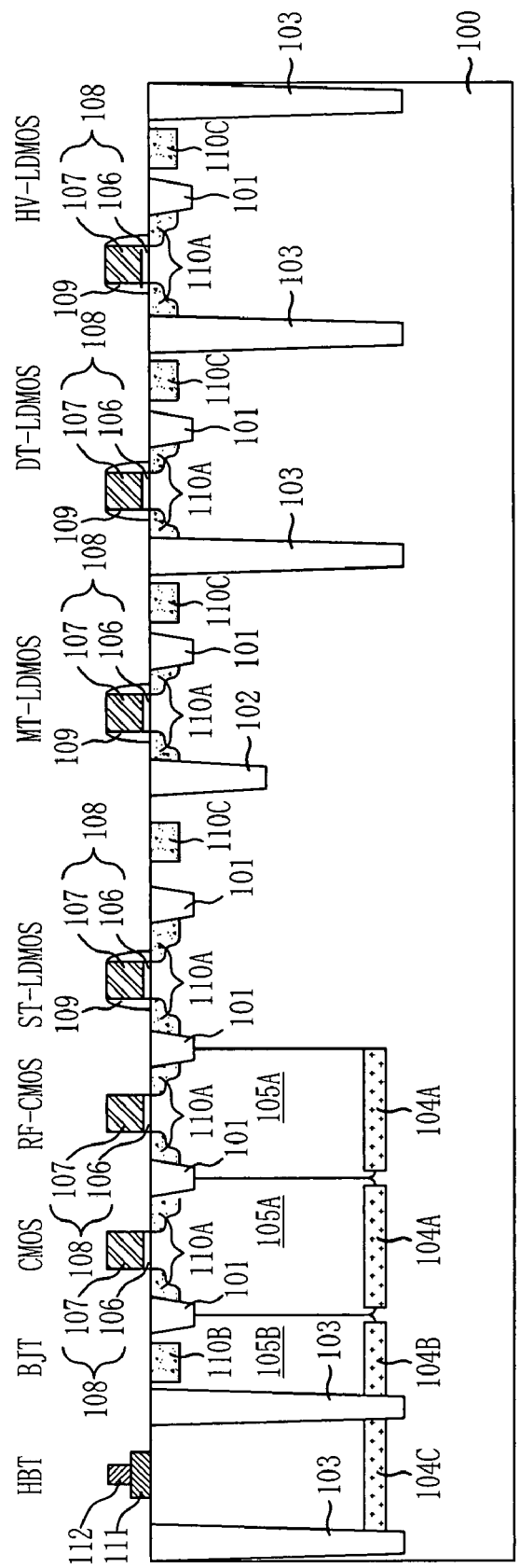
FIG. 1 illustrates a semiconductor integrated circuit in accordance with an embodiment of the present invention.

Hereinafter, detailed descriptions on certain embodiments of the present invention will be provided with reference to the accompanying drawings. Herein, thickness of layers and regions may be magnified in the accompanying drawings to clearly show the layers and the regions. Also, when a layer is described to be formed over the other layer or a substrate, either the layer can be directly formed on the other layer or the substrate, or a third layer may be disposed therebetween. Furthermore, the same or like reference numerals denote the same or like constitution elements even in different drawings.

In more details, some of devices including digital circuits, analog circuits and radio frequency (RF) circuits are exemplified in this embodiment of the present invention for the sake of explanation. For instance, the devices of the analog circuits include a hetero junction bipolar transistor (HBT), a bipolar junction transistor (BJT), and a complementary metal oxide semiconductor (CMOS) device. The devices of the digital circuits include a lateral double diffused metal oxide semiconductor (LDMOS) device. The devices of RF circuits include a RF CMOS device.

FIG. 1 illustrates a semiconductor integrated circuit in accordance with an embodiment of the present invention. The semiconductor integrated circuit supports devices of analog circuits, devices of radio frequency (RF) circuits, and devices of digital circuits disposed over a single substrate 100. The number, structure and arrangement of the devices of each circuit are not limited in this embodiment of the present invention.

The semiconductor integrated circuit includes a plurality of deep-wells 104A formed to a certain depth inside the substrate 100. The deep-wells 104A surround regions where the devices of the analog circuits, the devices of the RF circuits and the devices of the digital circuits are to be formed.

The deep-wells 104A are formed at the regions where the devices of the digital circuits are formed because an electric noise generated from the semiconductor integrated circuit are mostly generated at the digital circuits. Accordingly, it is more advantageous in a fabrication cost to form the deep-wells 104A to surround only the region where the devices of the digital circuits are to be formed than to form the deep-wells 104 to surround both regions where the devices of the analog circuits and the devices of the RF circuits are to be formed. However, as shown in this embodiment of the present invention, if the region where the devices of the digital circuits are to be formed is larger than the regions where the devices of the analog circuits and the devices of the RF circuits are to ε formed, the deep-wells 104A can be formed at the regions where the devices of the analog circuits and the devices of the RF circuits are to be formed.

Considering the electric side, various circuits are integrated on a certain conductive type single substrate of the semiconductor integrated circuit. The single substrate serves as resistance which couples devices of all types of circuits together. Accordingly, the devices of the various types of the circuits are disposed strategically on the deep-wells 104A to isolate the devices of the circuits from each other. As a result, the devices of the various circuits can be integrated over the single substrate.

As described above, the deep-wells 104A prevent cross talk between the analog circuits and the digital circuits. The deep-wells 104A can be formed via an ion implantation process which is considered as a relatively simple process. Also, a silicon on insulator (SOI) substrate in which a buried oxide (BOX) layer is formed can be used to prevent the cross talk between the analog circuits and the digital circuits instead of using the deep-wells 104A. However, the use of the SOI substrate affects a fabrication cost. Accordingly, a cheap bulk substrate is used and the deep-wells 104A are formed via the ion impanation process.

For instance, the deep-wells 104A can be modified according to each conductive type of the substrate 100. In the case of using a P-type substrate, the deep-wells 104A are doped with an N-type impurity, and in the case of using an N-type substrate, the deep-wells 104A are doped with a P-type impurity.

The semiconductor integrated circuit further includes a shallow trench isolation (STI) type device isolation structure 101, a medium trench isolation (MTI) type device isolation structure 102, and a deep trench isolation (DTI) type device isolation structure 103 to embody dynamic ranges, e.g., voltage ranges, of the devices of the various circuits.

The STI type device isolation structure 101 is formed in a trench with a depth less than about 1 .mu.m from a top surface for electric isolation among low voltage devices which can be enabled at a voltage less than about 10 V. For instance, the low voltage devices include a bipolar junction transistor (BJT), a complementary metal oxide semiconductor (CMOS) device, a RF-CMOS device and a shallow trench isolation lateral double diffuse metal oxide semiconductor (ST-LDMOS) device.

The MTI type device isolation structure 102 is formed in a trench with a depth ranging from about 1 μm to about 3 μm from the top surface of the substrate 100 for electric isolation among medium voltage devices which can be enabled at a voltage ranging from about 10 V to about 30 V or between the low voltage devices and the medium voltage devices. For instance, the medium voltage devices include a medium trench lateral diffuse metal oxide semiconductor (MT-LDMOS) device.

The DTI type device isolation structure 103 is formed in a trench with a depth more than about 3 μm from the top surface of the substrate 100 for electric isolation among high voltage devices which can be enabled at a voltage greater than about 30 V, between the high voltage devices and the low voltage devices, or between the high voltage devices and the medium voltage devices. For instance, the high voltage devices include a deep trench isolation lateral diffuse metal oxide semiconductor (DTI-LDMOS) device enabled at a voltage ranging from about 30 V to about 50 V, a high voltage well lateral diffuse metal oxide semiconductor (HV-LDMOS) device enabled at a voltage ranging from about 50 V to about several hundreds V, and a hetero junction bipolar transistor (HBT) for high voltage. Particularly, the trench has the depth ranging from about 3 μm to about 50 μm. For instance, the trench has the depth raging from about 3 μm to about 10 μm.

The semiconductor integrated circuit includes a well (not shown) for high voltage to embody the HV-LDMOS device which is enabled at a voltage ranging from about 50 V to about hundreds V among the devices of the digital circuits. To form the well for the high voltage, a medium implantation (MI) process is performed instead of forming an epitaxial layer at a portion of the substrate 100 where the HV-LDMOS device is to be formed and then, a drive-in process is performed to form the well for the high voltage.

For the medium implantation (MI) process, an impurity is implanted into the substrate 100 by setting a portion corresponding to the depth ranging from about 1 μm to about 3 μm from the top surface of the substrate 100 as an ion implantation target to make the impurity to be implanted to the portion corresponding to the depth raging from about 1 μm to about 3 μm from the top surface of the substrate 100. The drive-in process controls a temperature and a process period to make the amount of the impurity implanted to the certain depth have a desirable ion implantation depth and concentration distribution.

Devices which are shown in FIG. 1 but not explained will be described in more detail with reference to FIGS. 2A to 2F. FIGS. 2A to 2F illustrate a method for fabricating the semiconductor integrated circuit shown in FIG. 1.

As shown in FIG. 2A, since the HV-LDMOS device requires the largest depletion region, the well (not shown) for high voltage which have the largest thermal budget is formed. The well for the high voltage is formed via the medium implantation process and the drive-in process. In more detail about the formation of the well for the high voltage, an N-type or P-type impurity is implanted into the substrate 100 to a certain depth. Then, the drive-in process is performed at a temperature ranging from about 1,000° C. to about 1,200° C. for about 2 hours to about 15 hours to form the well for the high voltage at a depth ranging from about several ones μm to about several tens μm from the top surface of the substrate 100. The depth of the well for the high voltage is same as that of an epitaxial layer for a typical high voltage device. A well for the DT-LDMOS can commonly use the well for the high voltage of the HV-LDMOS.

The STI, MTI, and DTI type device isolation structures 101, 102 and 103 are formed inside the substrate 100 for device isolation. The STI, MTI, and DTI type device isolation structures 101, 102 and 103 are formed in different structures. The STI type device isolation structure 101, the MTI type device isolation structure 102, and the DTI type device isolation structure 103 have different depths to take as much dynamic range of the device embodied on the semiconductor integrated circuit as possible.

Each of the STI, MTI, and DTI type device isolation structures 101, 102 and 103 can be formed via two methods. The first method is a filling method using an insulation layer. According to the first method, the substrate 100 is etched to a certain depth to form a trench. Then, the insulation layer, e.g., a high density plasma (HDP) oxide layer having a good filling property, fills the trench. A chemical mechanical polishing (CMP) process is performed to planarize the HDP oxide layer.

The second method is an ion implantation method using an oxygen ion. According to the second method, the oxygen ion having an insulation property is directly implanted to the substrate 100. To form the STI, MTI, and DTI structures via the second method, a stack implantation process is used instead of using a typical ion implantation process.

The stack implantation process is performed changing a level of ion implantation energy during a whole process step. The oxygen ion is implanted to the deepest portion applying the highest level of the ion implantation energy. Then, the level of the ion implantation energy is gradually decreased to form the STI, MTI, and DTI type device isolation structures.

As an example, a method for forming the STI type device isolation structure 101 having the STI structure by using the first method will be explained hereinafter. A buffer oxide layer and a pad nitride layer serving as a hard mask are formed over the substrate 100. Then, a photolithography process is performed to form an etch mask thereon. An etching process is performed using the etch mask to etch the pad nitride layer, the buffer oxide layer and a portion of the substrate 100. As a result, a trench with a small thickness at least less than about 1 μm is formed. An oxidation process is performed on inner sidewalls of the trench to form a wall oxide layer. An HDP oxide layer is formed to fill the trench and then, a chemical mechanical polishing (CMP) process is performed to planarize the HDP oxide layer. The pad nitride layer and the buffer oxide layer are removed, thereby obtaining the STI type device isolation structure 101.

The MTI type device isolation structure 102 and the DTI type device isolation structure 103 can be formed using the same method used to form the STI type device isolation structure 101. However, the MTI type device isolation structure 102 is formed to a thickness ranging from about 1 μm to about 3 μm, and the DTI type device isolation structure 103 is formed to a thickness greater than about 3 μm.

As shown in FIG. 2B, the deep wells 104A are formed so as to surround portions where the analog circuits are to be formed or potions where the digital circuits are to be formed to reduce cross talk between the devices of the analog circuits and the devices of the digital circuits. For instance, the deep wells 104A are doped with an N-type impurity in the P-type substrate 100. At the portions where the devices of the analog circuits including the CMOS device and RF-CMOS devices are to be formed, a high level of ion implantation energy is applied to form the deep wells 104A. While forming the deep-wells 104A, a collector 104B is formed at a portion where the HBT is to be formed and the other collector 104C is formed at a potion where the BJT is formed. The collectors 104B and 104C have the same concentration and thickness to those of the deep wells 104A.

As shown in FIG. 2C, a plurality of wells 105A are formed at portions where devices other than the HV-LDMOS device and DT-LDMOS device, e.g., the CMOS device, the RF-CMOS device, the ST-LDMOS device, and the MT-LDMOS device. The wells 105A have a concentration smaller than that of the deep wells 104A. Although not shown for the sake of explanation, the wells 105A are also formed at portions where the ST-LDMOS device and MT-LDMOS device are to be formed.

As shown in FIG. 2D, while forming the wells 105A, a base 105B is formed at the portion where the BJT is to be formed. To increase a gain of the BJT, it is better to decrease a width of the base 105B. Accordingly, a separate photolithography process and a separate ion-implantation process are performed to form the collector 104B by applying a low level of the ion implantation energy than those applied to form the deep-wells 104A. Accordingly, the collector 104B is formed to a thickness smaller than those of the deep wells 104A formed to surround neighboring devices among the devices of the analog devices from the top surface of the substrate 100.

A plurality of gate electrodes 108 are formed over the substrate 100. Each of the gate electrodes 108 is formed stacking a gate insulation layer 106 and a gate conductive layer 107. The gate insulation layer 106 can be one of an oxide layer, e.g., a silicon oxide ($SiO_2$) layer, and a stack structure including an oxide layer and a nitride layer. The gate conductive layer 107 is formed using one selected from a group consisting of a polysilicon layer, a transition metal, a rare earth metal, an alloy layer, a metal nitride layer, a metal silicide layer, and a combination thereof. The gate electrodes 108 of the LDMOS devices are formed in vertical structures as shown in FIG. 2D; however, the gate electrodes 108 of the LDMOS devices can be formed in recess structures.

As shown in FIG. 2E, an ion implantation process is performed to form lightly doped junction regions (not shown) to a small thickness in the substrate 100 exposed on both sides of each of the gate electrodes 108. A plurality of gate spacers 109 are formed over sidewalls of the gate electrodes 108. The gate spacers 109 include one selected from a group consisting of an oxide layer, a nitride layer, and a combination thereof.

A plurality of high doped junction regions 110A are formed in the substrate 100 exposed on both sides of the spacers 109 to thicknesses greater than those of the lightly doped junction regions (not shown). As a result, a plurality of source/drain regions of lightly doped drain (LDD) structures including the lightly doped junction regions and the high doped junction regions 110A are obtained.

While forming the highly doped junction regions 110A, an emitter 110B is formed at the portion where the BJT is to be formed. A plurality of pick up regions 110C are formed at portions other than the portion where the BJT device is to be formed to supply a bias to each of the wells 105A.

As shown in FIG. 2F, a base 111 and an emitter 112 are formed over the substrate 100 where the HBT device is to be formed. The base 111 includes silicon germanium (SiGe). The emitter 112 includes a polysilicon layer.

Although not shown, a RF passive device and a transformer device can be formed at the portion where the RF CMOS device is to be formed. The RF passive device includes one selected from a group consisting of a metal-insulator-metal (MIM) capacitor, a resistor, and an inductor. Also, a metal interconnection line can be formed to connect devices within the integrated circuit with each other. The inductor includes aluminum or copper.

According to this embodiment of the present invention, the following effects can be obtained. First, for a single integrated circuit to simultaneously support digital circuits, analog circuits, and RF circuits, deep-wells are formed in a manner to surround portions where devices of the analog circuits are to be formed or portions where devices of the digital circuits are to be formed. Accordingly, the analog circuits can be stably isolated from an electric noise.

Secondly, for the single integrated circuit to simultaneously support the digital circuits, the analog circuits and the RF circuits, a STI type device isolation structure, a MTI type device isolation structure, and a DTI type device isolation structure are formed instead of forming a typical device isolation structure via a local oxidation of silicon (LOCOS) process. Accordingly, a size of the single integrated circuit can be reduced compared to that of the typical integrated circuit.

Thirdly, for the single integrated circuit to simultaneously support the digital circuits, the analog circuits and the RF circuits, the devices having large dynamic ranges, i.e., large voltage ranges, can be stably isolated due to the formation of the STI, MTI, and DTI device isolation structures.

Fourthly, for the single integrated circuit to simultaneously support the digital circuits, the analog circuits and the RF circuits, since the devices are isolated by forming the STI, MTI, and DTI type device isolation structures, it is possible to reduce lengths of junction region, which are formed with the relatively large lengths among junction regions (source and drain regions) of LDD structures formed asymmetrically to isolate the typical devices. As a result, a whole size of the semiconductor integrated circuit can be reduced.

Lastly, for the single integrated circuit to simultaneously support the digital circuits, the analog circuits and the RF circuits, wells for high voltage are formed via an ion implantation process and a drive-in process instead of forming an epitaxial layer. The wells for the high voltage serve the same function as the epitaxial layer. As a result, a fabrication cost can be reduced as compared to the typical integrated circuit formed by forming the epitaxial layer.

While the present invention has been described with respect to the specific embodiments, it will be apparent to those skilled in the art that various changes and modifications may be made without departing from the spirit and scope of the invention as defined in the following claims.

What is claimed is:

1. A semiconductor integrated circuit including digital circuits, analog circuits, and radio frequency (RF) circuits integrated on a single substrate, comprising:
   the substrate including portions where the digital circuits, the analog circuits, and the RF circuits are to be formed, wherein the digital circuits have an area greater than that of the analog circuits and the RF circuits;
   a plurality of deep-wells formed to a certain thickness inside the substrate below portions where devices of the analog circuits and the RF circuits are to be formed to reduce cross talk between the devices of the analog circuits and the RF circuits, and the devices of the digital circuits, wherein the deep-wells have a conductive type opposite to the substrate; and
   a plurality of device isolation structures configured to isolate each device of the digital circuits, the analog circuits and the RF circuits, and have different thicknesses from a top surface of the substrate according to dynamic ranges of the devices,
   wherein the devices of the RF circuits comprise a RF CMOS device including a RF passive device and a transformer device.

2. The semiconductor integrated circuit of claim 1, wherein the device isolation structure include:
   a shallow trench isolation (STI);
   a medium trench isolation (MTI); and
   a deep trench isolation (DTI).

3. The semiconductor integrated circuit of claim 2, wherein STI is formed to a first thickness, the MTI is formed to a second thickness greater than the first thickness, and the DTI is formed to a third thickness greater than the second thickness.

4. The semiconductor integrated circuit of claim 3, wherein the first thickness ranges from about 0.1 μm to about 1 μm.

5. The semiconductor integrated circuit of claim 3, wherein the second thickness ranges from about 1 μm to about 3 μm.

6. The semiconductor integrated circuit of claim 3, wherein the third thickness ranges from about 3 μm to about 50 μm.

7. The semiconductor integrated circuit of claim 1, wherein the deep-wells are formed to the certain thickness between the second and third thicknesses.

8. The semiconductor integrated circuit of claim 1, further comprising a plurality of wells formed over the deep-wells, the wells having a concentration lower than the deep-wells.

9. The semiconductor integrated circuit of claim 1, wherein the device isolation structures are formed in the substrate via a stack implantation process using an oxygen ion.

10. The semiconductor integrated circuit of claim 1, wherein the devices of the digital circuits comprise a shallow trench isolation lateral double diffused metal oxide semiconductor (ST-LDMOS), a medium trench isolation lateral double diffused metal oxide semiconductor (MT-LDMOS), a deep trench isolation lateral double diffused metal oxide semiconductor (DT-LDMOS), and a high voltage well lateral diffused metal oxide semiconductor (HV-LDMOS).

11. The semiconductor integrated circuit of claim 10, wherein the HV-LDMOS device is surrounded by a well for high voltage.

12. The semiconductor integrated circuit of claim 11, wherein the well for the high voltage include one of an N-type well and a P-type well.

13. The semiconductor integrated circuit of claim 11, wherein the well for the high voltage is formed by implanting an impurity to a certain thickness from a top surface of the substrate and by performing a drive-in process on the implanted impurity.

14. The semiconductor integrated circuit of claim 13, wherein the impurity is implanted to a thickness ranging from about 1 μm to about 3 μm from the top surface of the substrate.

15. The semiconductor integrated circuit of claim 13, wherein the drive-in process to the well for the high voltage is performed at a temperature ranging from about 1,000° C. to about 1,200° C. for a period ranging about 2 hours to about 15 hours.

16. The semiconductor integrated circuit of claim 1, wherein the devices of the analog circuits include a bipolar junction transistor (BJT), a complementary metal oxide semiconductor (CMOS) device, and a hetero junction bipolar transistor (HBT).

17. The semiconductor integrated circuit of claim 16, wherein the bipolar junction transistor (BJT) includes:
   a collector formed in the substrate to a certain thickness;
   an emitter formed in the substrate to be separated from the collector; and
   a base formed between the collector and the emitter.

18. The semiconductor integrated circuit of claim 17, wherein the collector is formed to the same concentration and thickness as those of the deep-wells.

19. The semiconductor integrated circuit of claim 17, wherein the collector is formed to a thickness smaller than those of the deep wells formed to surround neighboring devices among the devices of the analog devices from the top surface of the substrate.

20. The semiconductor integrated circuit of claim 16, wherein the hetero junction bipolar transistor (HBT) comprises:
   a collector formed to a certain thickness in the substrate;
   a base formed over the top surface of the substrate; and
   an emitter formed over the base.

21. The semiconductor integrated circuit of claim 20, wherein the collector is formed to the same concentration and thickness to those of the deep wells.

22. The semiconductor integrated circuit of claim 21, wherein a deep trench isolation (DTI) is formed between the HBT and the BJT.

23. The semiconductor integrated circuit of claim 1, wherein the RF passive device includes one selected from a group consisting of a metal-insulator-metal (MIM) capacitor, a resistor, and an inductor.

* * * * *